United States Patent
Braz et al.

(10) Patent No.: US 9,621,058 B2
(45) Date of Patent: Apr. 11, 2017

(54) REDUCING SWITCHING LOSSES ASSOCIATED WITH A SYNCHRONOUS RECTIFICATION MOSFET

(71) Applicant: Infineon Technologies Austria AG, Villach (AT)

(72) Inventors: Cesar Augusto Braz, Villach (AT); David Laforet, Villach (AT)

(73) Assignee: Infineon Technologies Austria AG, Villach (AT)

( * ) Notice: Subject to any disclaimer, the term of this patent is extended or adjusted under 35 U.S.C. 154(b) by 130 days.

(21) Appl. No.: 14/600,708

(22) Filed: Jan. 20, 2015

(65) Prior Publication Data

US 2016/0211757 A1   Jul. 21, 2016

(51) Int. Cl.
*H02M 3/335* (2006.01)
*H01L 29/78* (2006.01)
*H01L 25/03* (2006.01)
*H01L 29/66* (2006.01)
*H01L 29/40* (2006.01)
*H01L 27/02* (2006.01)
*H01L 29/739* (2006.01)
*H03K 17/14* (2006.01)
*H02M 1/00* (2006.01)
*H02M 1/34* (2007.01)

(52) U.S. Cl.
CPC ........ *H02M 3/33592* (2013.01); *H01L 25/03* (2013.01); *H01L 27/02* (2013.01); *H01L 27/0262* (2013.01); *H01L 29/407* (2013.01); *H01L 29/66356* (2013.01); *H01L 29/7391* (2013.01); *H01L 29/7804* (2013.01); *H01L 29/7806* (2013.01); *H01L 29/7808* (2013.01); *H03K 17/145* (2013.01); *H02M 2001/0054* (2013.01); *H02M 2001/346* (2013.01); *H03K 2217/0036* (2013.01)

(58) Field of Classification Search
CPC .......... H01L 27/0262; H01L 29/66356; H01L 29/7391; H01L 29/7804; H01L 29/7806; H01L 29/7808; H01L 29/407; H01L 25/03; H02M 3/33592
See application file for complete search history.

(56) References Cited

U.S. PATENT DOCUMENTS

| | | | |
|---|---|---|---|
| 7,738,226 B2 | 6/2010 | Berberich et al. | |
| 8,901,604 B2 * | 12/2014 | Mishra | H01L 29/0619 257/170 |
| 2014/0138740 A1 * | 5/2014 | Hu | H01L 29/66121 257/173 |

* cited by examiner

*Primary Examiner* — Joseph C Nicely
(74) *Attorney, Agent, or Firm* — Shumaker & Sieffert, P.A.

(57) ABSTRACT

A synchronous rectifier is described that includes a transistor device that has a gate terminal, a source terminal, a drain terminal, and a field-plate electrode. The field-plate electrode of the transistor device includes an integrated diode. The integrated diode is configured to discharge a parasitic capacitance of the transistor device during each switching operation of the synchronous rectifier. In some examples, the integrated diode is also configured to charge the parasitic capacitance of the transistor device during each switching operation of the synchronous rectifier.

20 Claims, 12 Drawing Sheets

US 9,621,058 B2

REDUCING SWITCHING LOSSES ASSOCIATED WITH A SYNCHRONOUS RECTIFICATION MOSFET

TECHNICAL FIELD

This disclosure relates to power circuits that use a metal-oxide-semiconductor field-effect-transistor (MOSFET) as a synchronous rectifier (SR).

BACKGROUND

Some switched-mode power converters perform synchronous rectification techniques as a way to boost efficiency of the power converter. With synchronous rectification, diodes (e.g., low-side switches of a half-bridge, secondary-side diodes of a flyback or synchronous rectifier, etc.) are replaced with "synchronous rectifiers" (SR). An example of a typical SR is a metal-oxide-semiconductor field-effect-transistor (MOSFET). While a SR MOSFET may increase the overall efficiency of the power converter by reducing the conduction losses that would otherwise arise if a diode were used, the power converter may experience other types of drawbacks that are attributed to the SR MOSFET.

For example, a SR MOSFET has an inherent output capacitance (Coss) that, when paired with inductive elements or inductive attributes of the power converter (e.g., leakage inductance of a transformer, other parasitic inductances, etc.), forms an LC circuit that tends to oscillate at a natural frequency given by Coss and L whenever the SR MOSFET stops conducting, its drain-source voltage may oscillate without dampening.

Accordingly, rather than select a SR MOSFET that meets the normal operating parameters of the power converter, the power converter may have to rely on a SR MOSFET that has a voltage rating that is sufficient to withstand a peak voltage associated with a potential oscillation. Such a SR MOSFET may have a higher cost and greater on-resistance $R_{DS\text{-}ON}$ which may reduce the efficiency of the power converter. In addition, the voltage oscillations may generates noise, such as electromagnetic interference (EMI), which may lead to other challenges and increased cost associated with the power converter.

Some power converters may include a resistive-capacitive (RC) snubber circuit to dampen and prevent voltage oscillations. However, the introduction of the RC snubber circuit may cause energy to be lost during switching operations of the SR MOSFET which may prevent the power converter from achieving its otherwise maximum potential efficiency.

SUMMARY

In general, circuits and techniques are described for reducing energy losses (e.g., switching losses) attributed to the charging and discharging of parasitic capacitances of a metal-oxide-semiconductor field-effect-transistor (MOSFET) when the MOSFET is used as a synchronous rectifier (SR) in a switched-mode power converter. Rather than rely on a purely resistive element in the field-plate electrode to charge and discharge the parasitic capacitances, an example SR MOSFET includes an integrated diode in the field-plate electrode. The integrated diode configures the field-plate electrode to have sufficient resistance to handle the charging phase of the parasitic capacitances of the SR MOSFET and configures the field-plate to have virtually no resistance during the discharge phase of the parasitic capacitances of the SR MOSFET.

In one example, the disclosure is directed to a metal-oxide-semiconductor field-effect-transistor (MOSFET) configured as a synchronous rectifier, the MOSFET comprising: a body diode; a gate terminal; a source terminal; a drain terminal; and a field-plate electrode comprising an integrated diode, wherein the integrated diode is configured to dampen voltage overshoots and attenuate oscillations associated with a voltage between the source terminal and drain terminal In another example, the disclosure is directed to a transistor device configured as a synchronous rectifier, the transistor device comprising: gate terminal; a source terminal; a drain terminal; and a field-plate electrode including an integrated diode, wherein the integrated diode is configured to discharge a parasitic capacitance of the transistor device during each switching operation of the synchronous rectifier.

In another example, the disclosure is directed to a system system comprising: a power source configured to provide power; a load configured to receive power; and a switch-based-mode power converter configured to convert and deliver the power provided by the power source to the load, the switch-based-mode power converter including: at least one metal-oxide-semiconductor field-effect-transistor device (MOSFET) that is configured as a synchronous rectifier, wherein the at least one MOSFET comprises a field-plate electrode configured to dampen voltage overshoots and attenuate oscillations associated with a drain-source voltage of the at least one MOSFET during switch-off of the at least one MOSFET.

The details of one or more examples are set forth in the accompanying drawings and the description below. Other features, objects, and advantages of the disclosure will be apparent from the description and drawings, and from the claims.

DETAILED DESCRIPTION

In general, circuits and techniques are described for reducing energy losses (e.g., switching losses) attributed to the charging and discharging of parasitic capacitances of a metal-oxide-semiconductor field-effect-transistor (MOSFET) when the MOSFET is used as a synchronous rectifier (SR) in a switched-mode power converter. Rather than rely on a purely resistive element in the field-plate electrode to charge and discharge the parasitic capacitances, an example SR MOSFET includes an integrated diode in the field-plate electrode. The integrated diode configures the field-plate electrode to have sufficient resistance to handle the charging phase of the parasitic capacitances of the SR MOSFET and configures the field-plate to have virtually no resistance during the discharge phase of the parasitic capacitances of the SR MOSFET.

That is, during the charging phase of the SR MOSFET parasitic capacitances, the integrated diode enables the field-plate electrode to turn energy into heat in order for peak voltage overshoots and oscillations to be attenuated. During the discharge phase, however, the integrated diode enables the field-plate electrode to fully recover the stored energy associated with the SR MOSFET parasitic capacitances. As such, the integrated diode produces a reduction of the overall switching losses while still damping any drain-source overshoot or oscillation that may occur during switch off In some examples, the blocking resistance associated with the integrated diode corresponds to the field-plate resistance (Rfp) of the field-plate electrode. And in some examples, a SR MOSFET includes a combination of one or more field-plate electrodes that have integrated diodes and one or more field-plate electrodes that have purely resistive elements.

In any event, by relying on one or more integrated diodes, the example SR MOSFET not only produces less switching losses than a typical SR MOSFET, but the example SR MOSFET also maintains its ability to inherently dampen any drain-source-voltage overshoots and oscillations that may otherwise occur during switch-off In this way, the example SR MOSFET may enable a power converter to achieve its maximum potential efficiency without relying on RC snubber circuitry and/or more rugged and expensive SR MOSFET technology.

Figure 1:
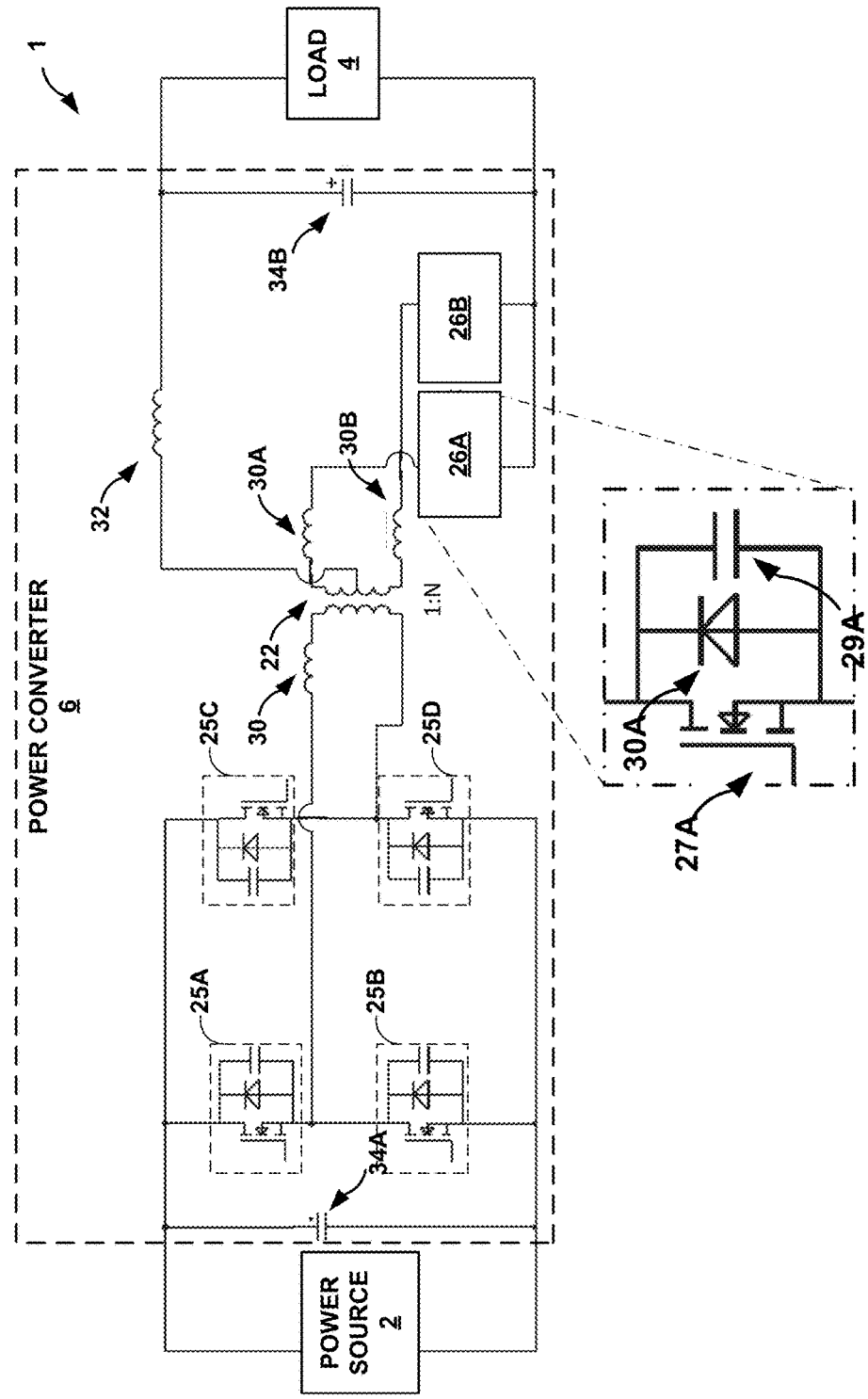
FIG. 1 is a conceptual diagram illustrating an example system that includes a power converter which for converting power from a power source using synchronous rectification techniques, in accordance with one or more aspects of the present disclosure. System 1 includes power source 2

FIG. 1 is a conceptual diagram illustrating system 1 for converting power from power source 2, using synchronous rectification techniques, in accordance with one or more aspects of the present disclosure. In general, system 1 relies on power converter 6 to convert power provided by power source 2 into a usable form of energy for powering load 4. System 1 may include more or fewer components than those shown in FIG. 1. For example, system 1 may include a controller configured to control power converter 6, control power source 2, and/or load 4. Such a controller may, for example, cause primary elements 25A-25D, SR MOSFET 26A, and SR MOSFET 26B to switch-on and switch-off in such a way as to vary a voltage level or amount of current provided to load 4.

Power source 2 provides electrical power and numerous examples of power source 2 exist. These examples may include, but are not limited to, power grids, generators, transformers, batteries, solar panels, windmills, regenerative braking systems, hydro-electrical or wind-powered generators, or any other form of devices that are capable of providing electrical power to system 1.

Load 4 (also sometimes referred to herein as device 4) receives the electrical power converted by power converter 6. In some examples, load 4 may use electrical power from power converter 6 to perform a function.

Power converter 6 converts one form of electrical power provided by power source 2 into a different, and usable form, of electrical power for powering load 4. In the example of system 1, electrical power delivered by power source 2 can be converted by converter 6 to power that has a regulated voltage and/or current level that meets the power requirements of load 4. For instance, power source 2 may output, and power converter 6 may receive, power which has a first voltage level. Power converter 6 may convert the power which has the first voltage level to power which has a second voltage level that is required by load 4. Power converter 6 may output the power that has the second voltage level. Load 4 may receive the converted power that has the second voltage level and load 4 may use the converted power having the second voltage level to perform a function (e.g., power a microprocessor, charge a battery, etc.).

In the example of FIG. 1, power converter 6 is shown as being a full-bridge DC/DC converter. However, other examples of power converter 6 exist and may include half-bridge converters, flyback converters, push-pull converters, forward converters (either interleaved or not), AC/DC converters, DC/DC converters, buck converters, boost converters, resonant converters and the like. The converters could also be bidirectional (e.g., load 4 could be a power source (just like in regenerative breaking, or in battery charging) where energy could be drained from load 4 and fed to power source 2. In the case of bidirectional converters, switches 25A-25D may also each work as a SR MOSFET and therefore could each be of similar type as SR MOSFET 26A and 26B.

Power converter 6 includes capacitive elements 34A and 34B, inductive element 32, and transformer 22. Power converter 6 also includes primary elements 25A-25D (collectively "primary elements 25"). Primary elements 25 are arranged in a full-bridge configuration and coupled, via inductor 30, to the primary side winding of transformer 22.

Transformer has a primary side to secondary side winding ration of 1:N. The secondary side winding of transformer 22 is bifurcated in two. Inductive element 30 represents the transformer leakage inductance (Llk) of the primary side of transformer 22. Inductive elements 30A and 30B represent the corresponding transformer leakage inductances (Llk1) and (Llk2) respectively. The sum of Llk1 and Llk2 approximately equals Llk.

Primary elements 25 are controlled in such a way as to cause energy to be transferred from power source 2 via transformer 22, to load 4. That is, primary elements 25 are controlled in such a way as to cause energy from power source 2 to build-up at the primary side winding of transformer 22. The energy is transferred via the core of transformer 22 to capacitive element 34B and out to load 4.

In general, power converter 6 is any power converter that relies on one or more metal-oxide-semiconductor field-effect-transistor (MOSFET) devices as synchronous rectifiers (SR). Consider that some power converters are required to achieve a certain level of efficiency. Synchronous rectification increases the converter efficiency by reducing conduction losses that would otherwise arise if diodes were used. That is, to aid in efficiency and to reduce energy losses, a power converter may replace its rectification diodes with actively controlled, synchronous rectifiers. Like a diode, the synchronous rectifier allows current to flow in the correct direction, and blocks current from flowing in the opposite (i.e., incorrect) direction. However, unlike the diode, the synchronous rectifier is more immune from energy loss or produces less losses than those produces by a diode.

Rather than include two diodes, power converter 6 includes SR MOSTET 26A and 26B. As used herein, a synchronous rectifying MOSFET (referred to simply as "SR MOSFET") represents any type of semiconductor or transistor based power switch device that is configured as a synchronous rectifier (e.g., any suitable combination of one or more discrete power switches, a MOSFET, a transistor based switching devices based on wide band gap materials such as a SiC MOSFET, GaN MOSFET, and the like).

One drawback of SR MOSTET 26A and 26B is that they may be prone to drain-source voltage overshoots and oscillations. For example, consider the more detailed view of SR MOSFET 26A shown at the bottom of FIG. 1. Although not shown for the sake of brevity, SR MOSFET 26B may include similar features as SR MOSFET 26A. SR MOSFET 26A includes transistor 27A, body diode 30A, and an inherent output capacitance (Coss) which is shown as capacitive element 29A. When capacitive element 29A combines with transformer leakage inductance 30A and other parasitic inductances of power converter 6, a LC circuit may be formed that oscillates at a natural frequency given by Coss multiplied by L (e.g., the sum of the leakage inductance 30A and the parasitic inductance of power converter 6). Whenever SR MOSFET 26A stops conducting, its drain-source voltage may oscillate without dampening.

Figure 2:
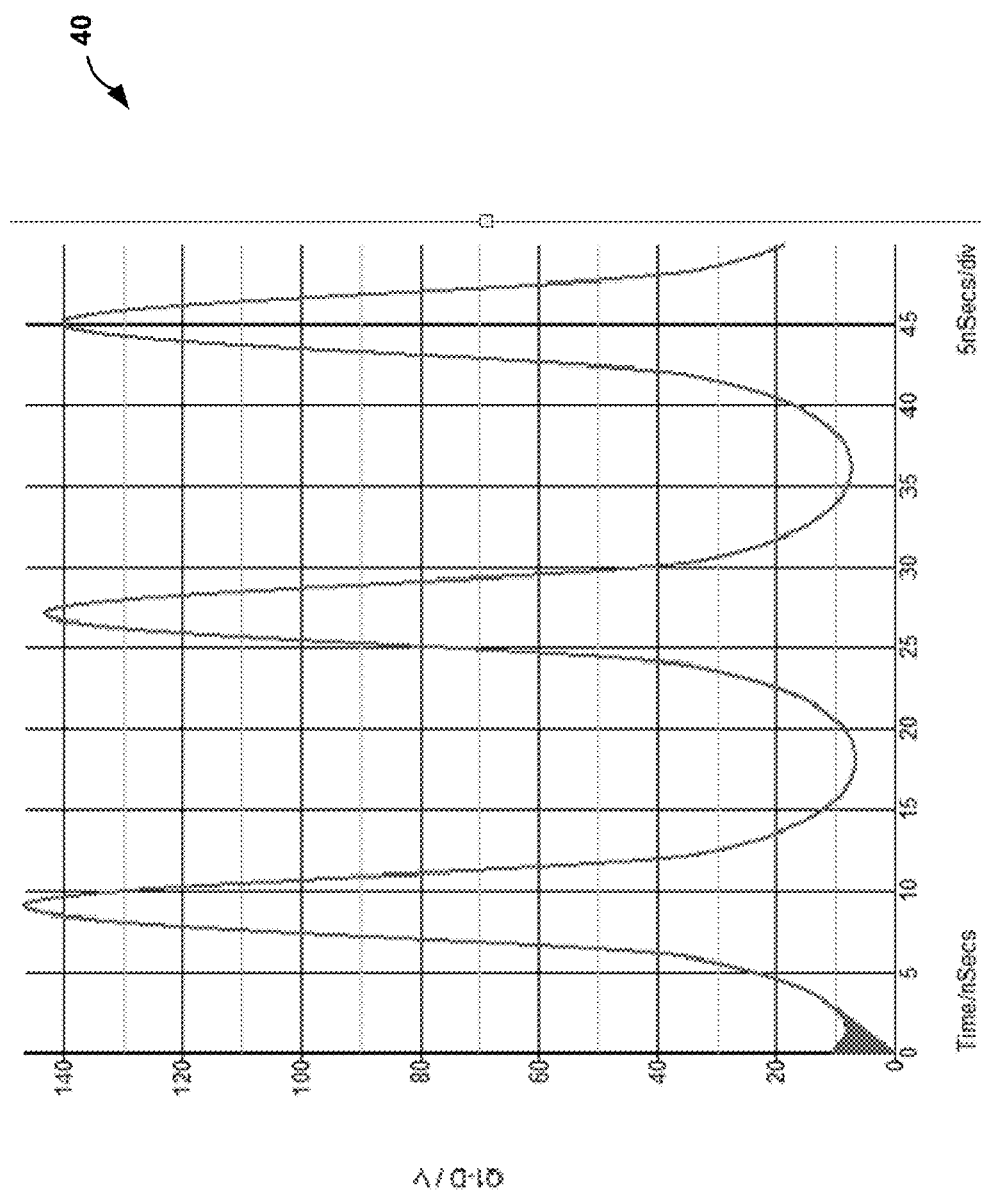
FIG. 2 is a voltage waveform illustrating oscillations of the drain-source voltage of a typical synchronous rectifier (SR) metal-oxide-semiconductor field-effect-transistor (MOSFET).

FIG. 2 is a voltage waveform illustrating oscillations of the drain-source voltage of a typical synchronous rectifier (SR) metal-oxide-semiconductor field-effect-transistor (MOSFET) such as SR MOSFET 26A and 26B of system 1 of FIG. 1. Plot 40 of FIG. 2 shows how, due to the LC circuit formed by the inherent output capacitance of a SR MOSFET and the other inductive elements and characteristics of a power converter, voltage overshoots and oscillations may form between the drain and source terminals of the SR MOSFET.

Accordingly rather than select a SR MOSFET that meets the normal operating parameters of the power converter, some power converters may have to rely on a SR MOSFET that has a voltage rating that is sufficient to withstand any peak voltage associated with potential oscillations. Such a SR MOSFET may have a higher cost and greater on-resistance $R_{DS-ON}$ which may reduce the efficiency of the power converter. In addition, the voltage oscillations may generates noise, such as electromagnetic interference (EMI), which may lead to other challenges and increased cost associated with the power converter.

Figure 3B:
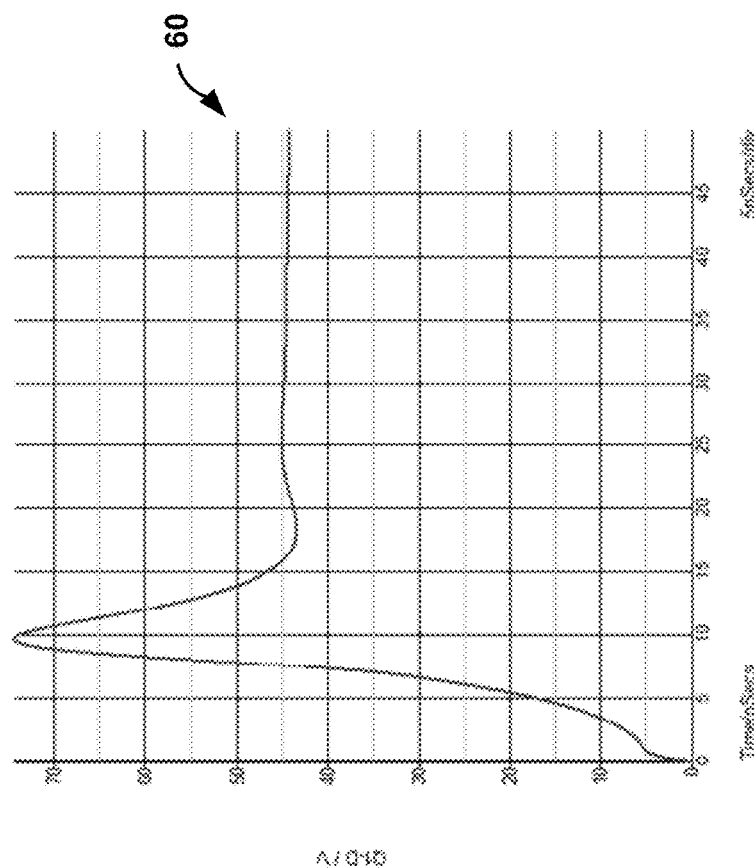
FIG. 3B is a voltage waveform illustrating the effects that the dissipative network of FIG. 3A has on the drain-source voltage of the typical SR MOSFET shown in FIG. 3A.
Figure 3A:
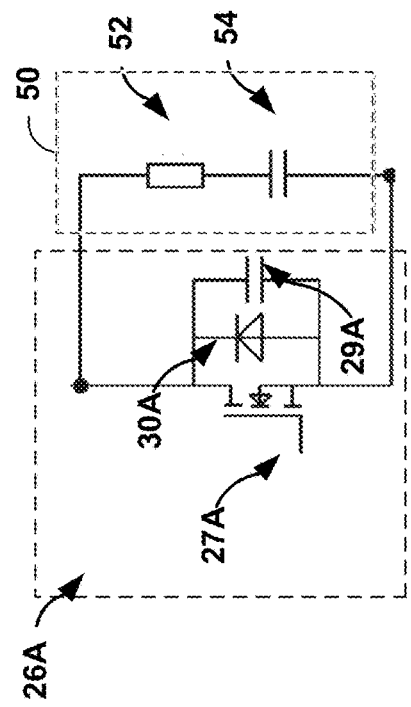
FIG. 3A is a circuit diagram illustrating a dissipative network that may reduce the peak drain-source voltage of a typical SR MOSFET and may prevent the voltage oscillations shown in FIG. 2.

FIG. 3A is a circuit diagram illustrating a dissipative network 50 that may reduce the peak drain-source voltage of a typical SR MOSFET and may prevent the voltage oscillations shown in FIG. 2. For example, consider SR MOSFET 26A from power converter 6 of FIG. 1 which is also shown in FIG. 3A. Rather than rely on the inherent ruggedness of SR MOSFET 26A to withstand voltage overshoots and oscillations depicted in FIG. 2, some power converters may include resistive-capacitive (RC) snubber circuit 50 which is configured to dampen and prevent these voltage oscillations altogether.

RC snubber circuit 50 includes resistive element 52 in series with capacitive element 54. RC snubber circuit 50 is connected to the drain and source of SR MOSFET 26A in order to dampen potential oscillations associated with the drain-source voltage of SR MOSFET 26A. Resistive element 52 introduces a damping effect by dissipating the energy trapped in the LC circuit caused by the inherent output capacitance of SR MOSFET 26A (i.e., capacitive element 29A) and the leakage inductance of transformer 22 (i.e., leakage inductance 30A).

FIG. 3B is a voltage waveform illustrating the effects that dissipative network 50 of FIG. 3A has on the drain-source voltage of SR MOSFET 26A. When compared to plot 40 of FIG. 2, plot 60 of FIG. 3B, shows the dampening effect of RC snubber circuit 50 reducing the voltage peak level and eliminating oscillations associated with the drain-source voltage of SR MOSFET 26. An added benefit of RC snubber circuit is that the dampening effect eliminates electromagnetic-interference (EMI) noise. As such, RC snubber circuit 50 may allow power converter 6 to rely on a MOSFET as SR MOSFET 26 with a much lower voltage class or lower voltage rating that is based on the peak secondary side voltage of transformer 22 rather than being based on the peak voltage of any unwanted oscillations.

However, the introduction of the RC snubber circuit 50 is not without drawbacks. RC snubber circuit 50 may cause energy to be lost during switching operations of the SR MOSFET 26A which may prevent power converter 6 from achieving its otherwise maximum potential efficiency. For example, RC snubber circuit 50 may cause power circuit 6 to lose energy due to capacitive element 54. Capacitive element 54 may charge and discharge itself through resistive element 52, thereby generating these additional energy losses.

For instance, the charging phase of capacitive element 54 may turn energy into heat at resistive element 52 in order for peak voltage overshoots and oscillations to be attenuated. During the discharge phase, however, part of the stored energy is lost in resititive element 52. That is, rather than preserve stored energy at capacitive element 54, resistive element 52 may produce heat and waste energy stored at capacitive element 54. As such, RC snubber circuit 50 still attributes to efficiency loss despite damping any drain-source overshoot or oscillation that may occur during switch off In addition to being less than an ideal solution to improve efficiency of power converter 6, RC snubber circuit 50 may be too complex and/or too costly for some power conversion applications.

Figure 4A:
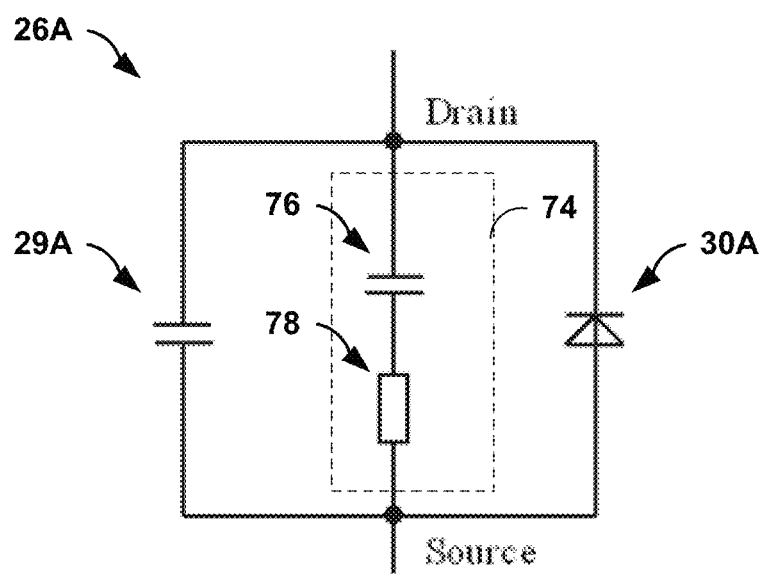
FIG. 4A is a conceptual diagram illustrating the field-plate capacitance and the field-plate resistance of a typical field-plate MOSFET.

FIG. 4A is a conceptual diagram illustrating the field-plate capacitance and the field-plate resistance of a typical field-plate MOSFET. That is, FIG. 4A shows an equivalent drain-source capacitance network circuit of SR MOSFET 26A as is shown in FIG. 3A. However, rather than rely on a discrete RC snubber circuit, SR MOSFET 26A relies on its inherent field-plate structure to function as an equivalent RC snubber circuit.

For example, FIG. 4A shows field-plate electrode 74 of SR MOSFET 26A in relation to its output capacitance 29A and body diode 30A. Field-plate electrode 74 is modeled as a series connection between resistive element 78 and capacitive element 76. Resistive element 78 represents the field-plate resistance Rfp of SR MOSFET 26A and capacitive element 76 represents the field-plate capacitance Cfp or parasitic capacitance of SR MOSFET 26A.

When compared with RC snubber circuit 50 of FIG. 3A, FIG. 4A clearly shows how capacitive element 76 and resistive element 78 form a natural (i.e., inherent) RC damping circuit associated with SR MOSFET 26A that could be used to naturally dampen voltage oscillations like those shown in FIG. 2.

However, the natural RC damping circuit formed by field-plate 74 suffers from the same drawbacks as RC snubber circuit 50. That is, while resistive element 78 appropriately conducts during the charging of capacitive element 76, unfortunately resistive element 78 also conducts during the discharging of capacitive element 76 thereby causing unwanted energy to be lost during each switching cycle.

Figure 4C:
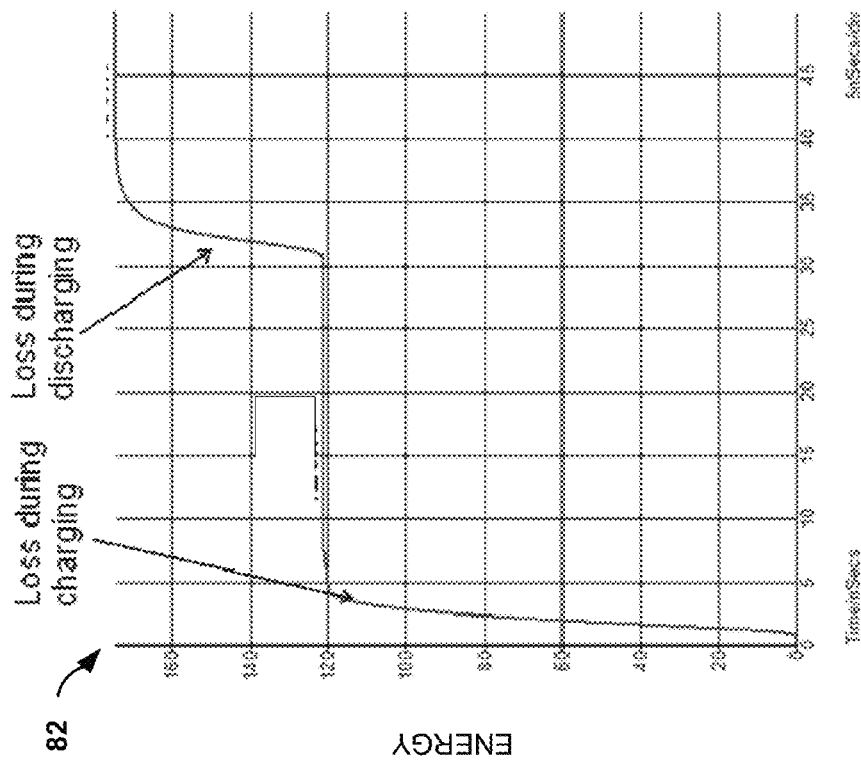
FIG. 4C is an energy waveform illustrating the energy lost during the charging and discharging phase of the parasitic capacitances of the field-plate MOSFET shown in FIG. 4A.
Figure 4B:
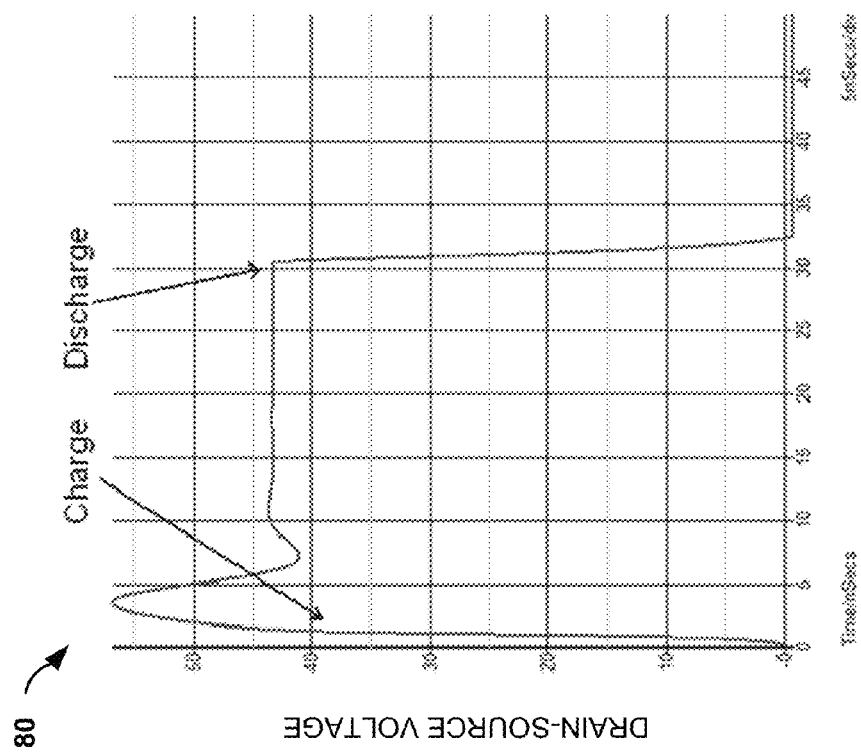
FIG. 4B is a voltage waveform illustrating the charging and discharging of the parasitic capacitances of the field-plate MOSFET shown in FIG. 4A.

FIGS. 4B and 4C are, respectively, a voltage waveform illustrating the charging and discharging phases of the parasitic capacitances of the field-plate MOSFET shown in FIG. 4A and an energy waveform illustrating the energy lost during the discharging phase of the parasitic capacitances of the SR MOSFET shown in FIG. 4A.

Plot 80 of FIG. 4A shows the drain-source voltage associated with SR MOSFET 26A during the charging and discharging phases of parasitic capacitance 76. Between times 0 and 10, parasitic capacitance 76 is charged and the drain-source voltage of SR MOSFET 26A is dampened. After time 30, parasitic capacitance 76 is discharged and the drain-source voltage of SR MOSFET 26A falls to zero.

Plot 82 of FIG. 4B shows the energy lost during charging and discharging phases of parasitic capacitance 76. Between times 0 and 10, the charging of parasitic capacitance 76 results in a loss of 120 energy units (e.g., nJ). After time 30, the discharging of parasitic capacitance 76 results in a loss of an additional 60 energy units. If compared to FIG. 2, the peak drain-source voltage shown in FIG. 4B has been attenuated by resistive element 78 and the oscillation of FIG. 2 has been suppressed, however, each of these benefits at the expense of the energy loss shown in FIG. 4C.

Every switching cycle of a SR MOSFET requires its parasitic capacitances to be fully charged and discharged. And while energy has to be turned into heat during the charging phase of the parasitic capacitance of the SR MOSFET in order for the peak voltage (overshoot) and the oscillations to be attenuated, the energy stored in the parasitic capacitance of the SR MOSFET that is lost during the discharge phase of the parasitic capacitance, could be fully recovered if, only during discharge of the parasitic capacitance, the field-plate resistance associated with the SR MOSFET had a negligible value.

Figure 5A:
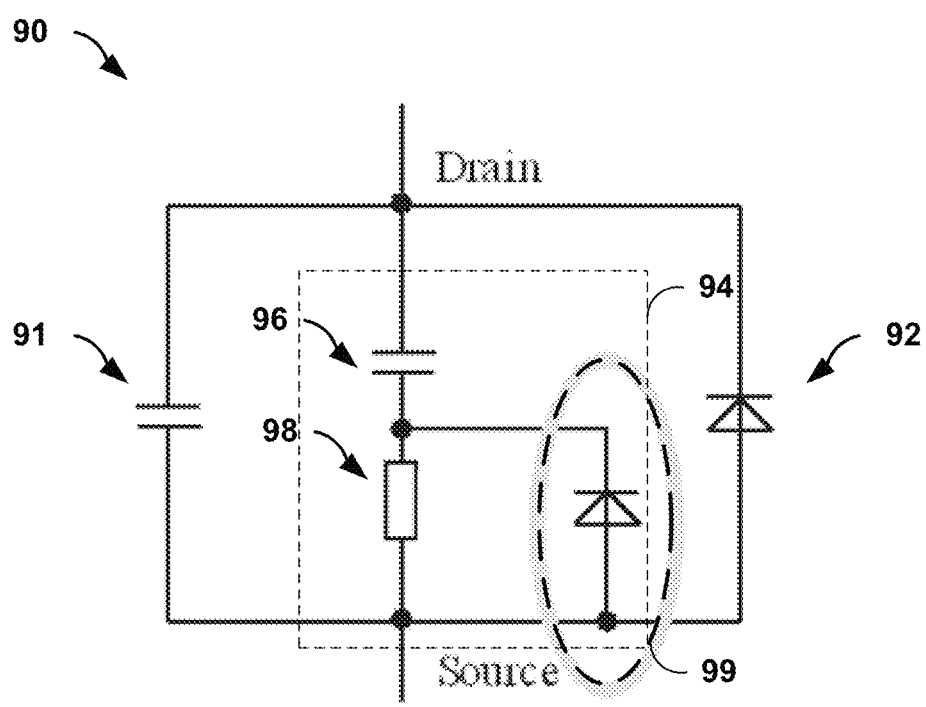
FIG. 5A is a conceptual diagram illustrating an example SR MOSFET that includes an integrate diode with the field-plate to prevent energy loss during the discharging phase of parasitic capacitances.

FIG. 5A is a conceptual diagram illustrating an example SR MOSFET that includes an integrated diode with the field-plate to prevent energy loss during the discharging phase of parasitic capacitance. SR MOSFET 90 can be used in the same applications that a typical SR MOSFET, such as SR MOSFET 26A and 26B can be used. However, SR MOSFET 90 offers the benefit of attenuated drain-source voltage overshoots, dampened oscillations, and in addition, less energy lost during each switching cycle.

Rather than relying solely on a purely resistive element 98 in field-plate electrode 94 to charge and discharge parasitic capacitances 96, SR MOSFET 90 includes integrated diode 99 in field-plate electrode 94. Integrated diode 99 configures field-plate electrode 94 to have sufficient resistance to handle the charging phase of parasitic capacitances 96 of SR MOSFET 90 and configures field-plate 94 to have virtually no resistance during the discharge phase of parasitic capacitances 96 of SR MOSFET 90 (e.g., to prevent switching losses). SR MOSFET 90 charges parasitic capacitance or field-plate capacitance 96 through resistive element 98 and discharges parasitic capacitance 96 through integrated diode 99.

That is, during the charging phase of parasitic capacitances 96, integrated diode 99 enables field-plate electrode 94 to turn energy into heat in order for peak voltage overshoots and oscillations to be attenuated. During the discharge phase, however, integrated diode 99 enables field-plate electrode 94 to fully recover the stored energy associated with parasitic capacitances 96. As such, integrated diode 99 produces a reduction of the overall switching losses while still damping any drain-source overshoot or oscillation that may occur during switch off In any event, by relying on one or more integrated diodes 99, SR MOSFET 90 not only produces less switching losses than a typical SR MOSFET, such as SR MOSFET 26A and 26B, but SR MOSFET 90 also maintains its ability to inherently dampen any drain-source-voltage overshoots and oscillations that may otherwise occur during switch-off In this way, SR MOSFET 90 may enable a power converter, such as power converter 6 or any other power converter that relies on a MOSFET as a synchronous rectifier, to achieve its maximum potential efficiency without relying on RC snubber circuitry and/or more rugged and expensive MOSFET technology.

Figure 5B:
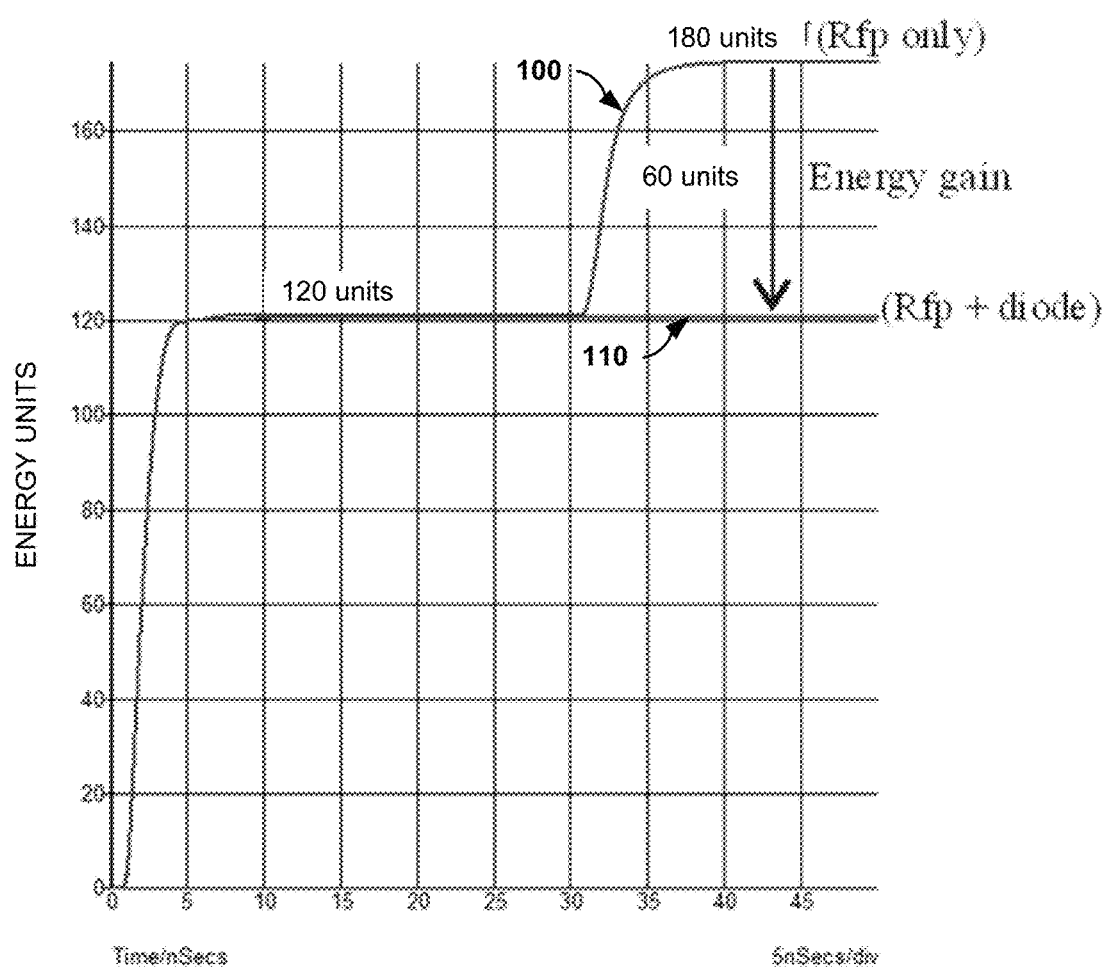
FIG. 5B is an energy waveform illustrating the energy gained during the discharging phase of the parasitic capacitances of the SR MOSFET shown in FIG. 5A as compared to the field-plate MOSFET shown in FIG. 4A.

FIG. 5B is an energy waveform illustrating the energy gained during the discharging phase of the parasitic capacitances of the SR MOSFET shown in FIG. 5A as compared to the SR MOSFET shown in FIG. 4A. Plot 100 corresponds to plot 82 of FIG. 4C. Plot 110 shows the energy lost during the discharging phase of parasitic capacitance 96. Between times 0 and 10, the charging of parasitic capacitance 96 results in a loss of 120 energy units (e.g., nJ). After time 30, the discharging of parasitic capacitance 96 does not result in a loss of anymore energy units. In other words, as compared to the discharging of parasitic capacitance 76 of SR MOSFET 26A, integrated diode 99 causes a net energy gain of 60 energy units during the discharging of parasitic capacitance 96.

Figure 5C:
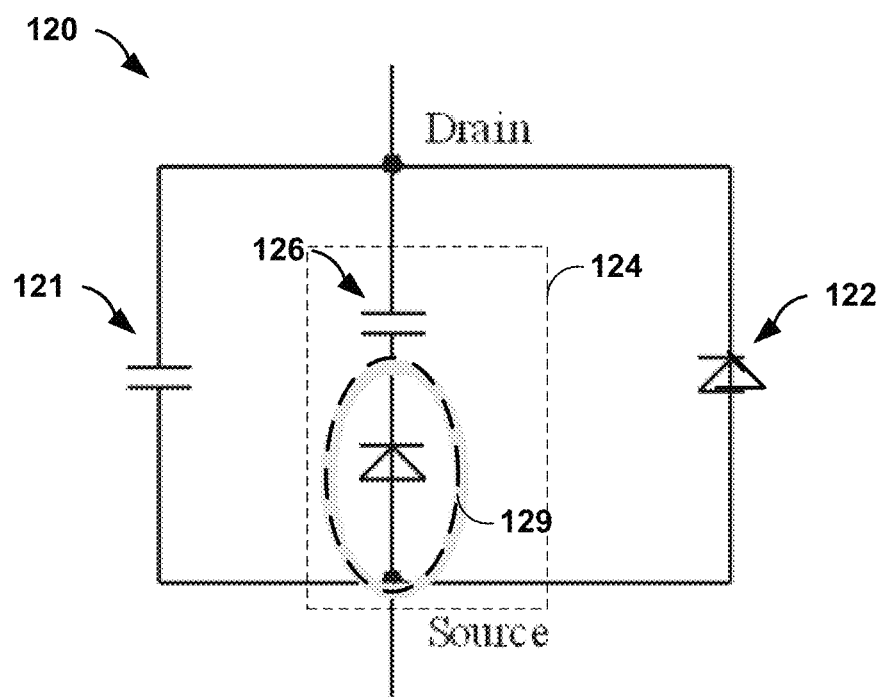
FIG. 5C is a conceptual diagram illustrating the example SR MOSFET shown in FIG. 5A with an integrated diode that has a blocking resistance that is equivalent to the field-plate resistance of the SR MOSFET.

FIG. 5C is a conceptual diagram illustrating the example SR MOSFET shown in FIG. 5A with an integrated diode that has a blocking resistance that is equivalent to the field-plate resistance of the SR MOSFET. Like SR MOSFET 90, SR MOSFET 120 of FIG. 5C can be used in the same applications that a typical SR MOSFET, such as SR MOSFET 26A and 26B can be used. In addition, SR MOSFET 120 offers the same benefit of attenuated drain-source voltage overshoots, dampened oscillations, and in addition, less energy lost during each switching cycle that SR MOSFET 90 offers.

The difference between SR MOSFET 90 and SR MOSFET 120 is that integrated diode 129 is selected to have a blocking resistance equal to that of the field-plate resistance of field-plate 124. Said another way, the blocking resistance associated with integrated diode 129 corresponds to the necessary field-plate resistance of field-plate electrode 124 that is required to produce sufficient heat to charge parasitic capacitance 126.

Accordingly, a SR MOSFET according to this disclosure may have a significantly reduced amount of switching loss as compared to typical SR MOSFET devices that is otherwise attributed to field-plate resistances. Additionally, a SR MOSFET according to this disclosure may inherently dampen drain-source voltage during switch off without the need for RC snubber circuitry. As such, the SR MOSFET described herein enables a power converter to rely on fewer components, which lowers, costs, reduces parasitics, reduces size (e.g., printed circuit board real estate) etc., than other solutions.

Figure 6A:
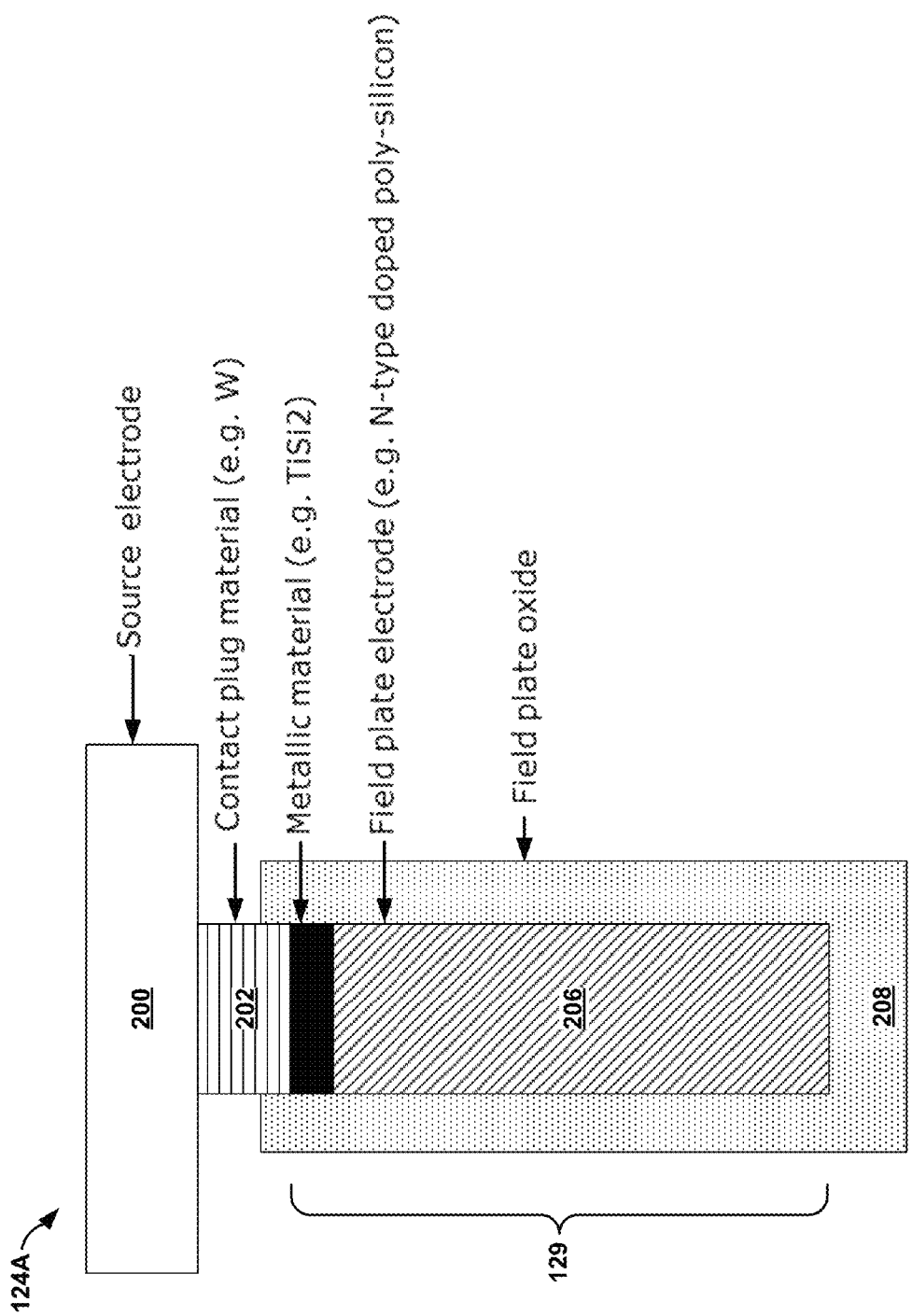
FIG. 6A is a conceptual diagram that illustrates a cross-sectional view of a field-plate electrode of the example SR MOSFET shown in FIG. 5C when the integrated diode is a Schottky diode.
Figure 6B:
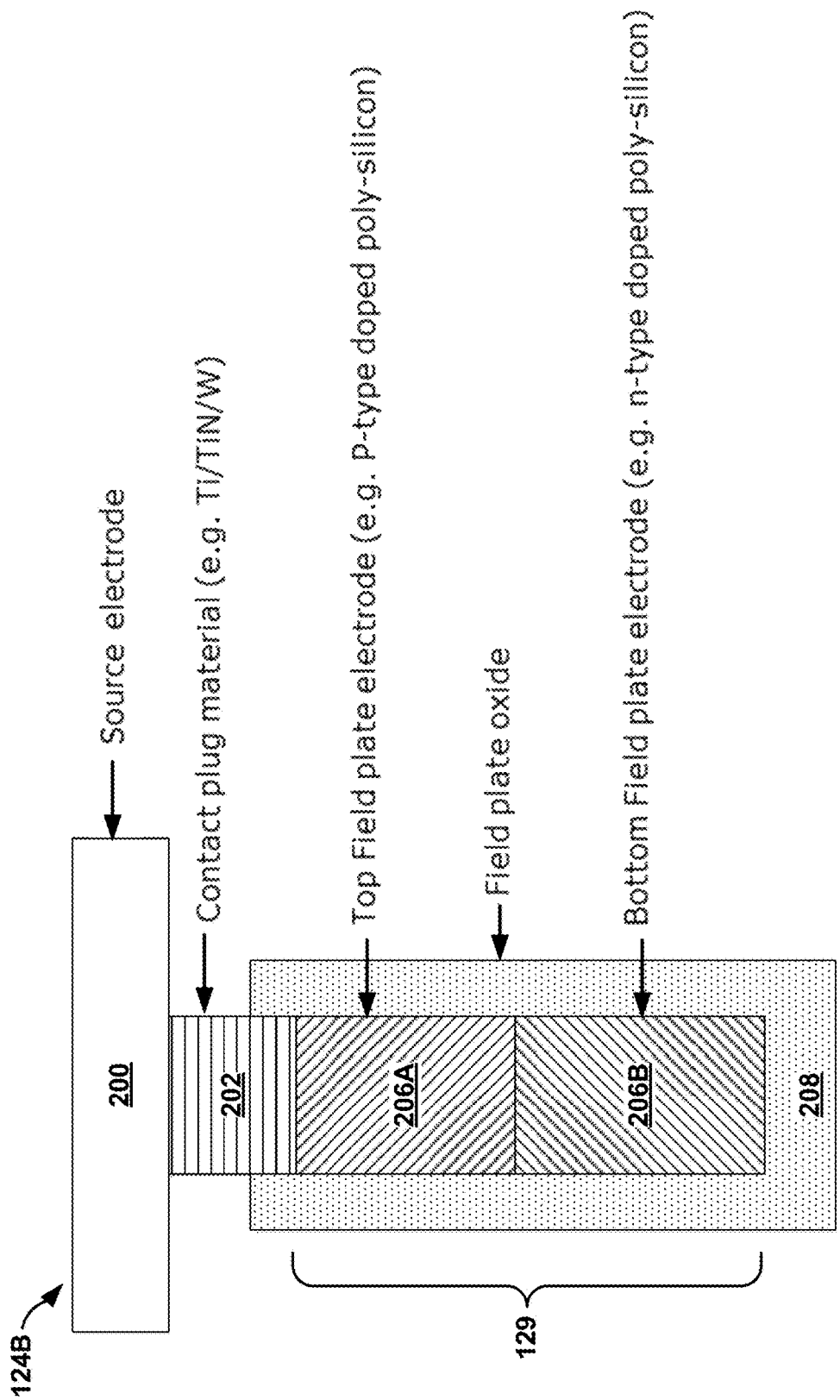
FIG. 6B is a conceptual diagram that illustrates a cross-sectional view of a field-plate electrode of the example SR MOSFET shown in FIG. 5C when the integrated diode is a P-N junction diode.

FIGS. 6A and 6B are conceptual diagrams illustrating cross-sectional views of two different example field-plate electrodes of the example SR MOSFET shown in FIG. 5C. FIGS. 6A and 6B show field-plate electrodes 124A and 124B respectively, as different examples of field-plate 124 of SR MOSFET 120 and its connection to source electrode 200. One of ordinary skill will appreciate that rest of the SR MOSFET 120 not shown in FIGS. 6A and 6B can be formed from any type of power MOSFET with field plate. Therefore the shape of field plate 124A and 124B in FIGS. 6A and 6B is arbitrary and can be adjusted to fit any type of device.

FIG. 6A is a conceptual diagram that illustrates a cross-sectional view of a field-plate electrode of the example SR MOSFET shown in FIG. 5C when the integrated diode is a Schottky diode. Integrated diode 129 of field-plate 124A is a Schottky diode. Field-plate electrode 206 may be a poly-silicon of n type doping connected to source electrode 200 through metallic material 204 (e.g., a titanium silicide layer) in contact with plug 202 (e.g., a tungsten plug).

FIG. 6B is a conceptual diagram that illustrates a cross-sectional view of a field-plate electrode of the example SR MOSFET shown in FIG. 5C when the integrated diode is a P-N junction diode. Integrated diode 129 of field-plate 124B is a poly-silicon P-N junction diode. Electrode bottom 206B may be filled with a poly-silicon of n type doping while electrode top 206A may be filled with a poly-silicon of p type doping.

Figure 7:
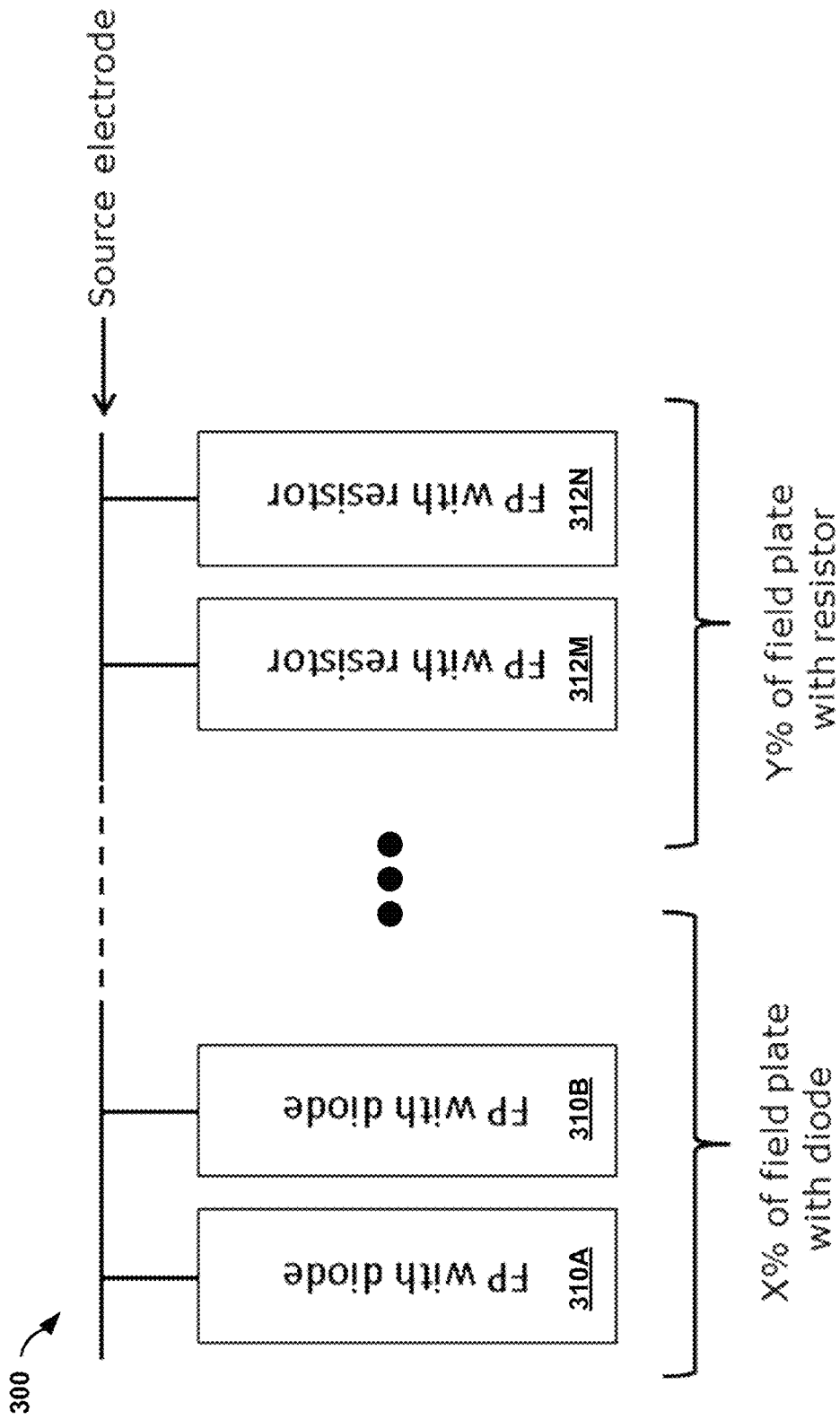
FIG. 7 is a conceptual diagram that illustrates an example of a fine-tuned SR MOSFET that includes some field-plate electrodes that have an integrated diode and some field-plate electrodes without the integrated diode.

FIG. 7 is a conceptual diagram that illustrates an example of a fine-tuned SR MOSFET that includes some field-plate electrodes that have an integrated diode and some field-plate electrodes without the integrated diode. In other words, in some examples, an example SR MOSFET described herein may include a combination of one or more field-plate electrodes that have integrated diodes and one or more field-plate electrodes that have purely resistive elements. Using a variety of field-plate electrodes in this way may enable the SR MOSFET to be precisely, fine tuned for a specific application.

FIG. 7 shows many transistors 310A-310N (collectively transistors 310) on SR MOSFET 300. Some of transistors 310 have integrated diodes in their field-plate, while some of transistors 310 are without integrated field-plate diodes. Only a certain percentage of field plate electrodes of transistors 310 could include integrated diode 90 or 120 described FIGS. 5A and 5C. The rest of the field plate electrodes of transistors 310 are using purely resistive elements (e.g. poly-silicon of n-type doping) in their field-plates.

The conceptual diagrams of FIGS. 6A, 6B, and 7 are all examples where the doping of the material constituting the field plate electrode depends on the specific diode characteristics required. In other words, to manufacture field-plate electrodes of FIGS. 6A, 6B, and 7, the doping may be varied to achieve a blocking impedance for a defined application condition.

Figure 8:
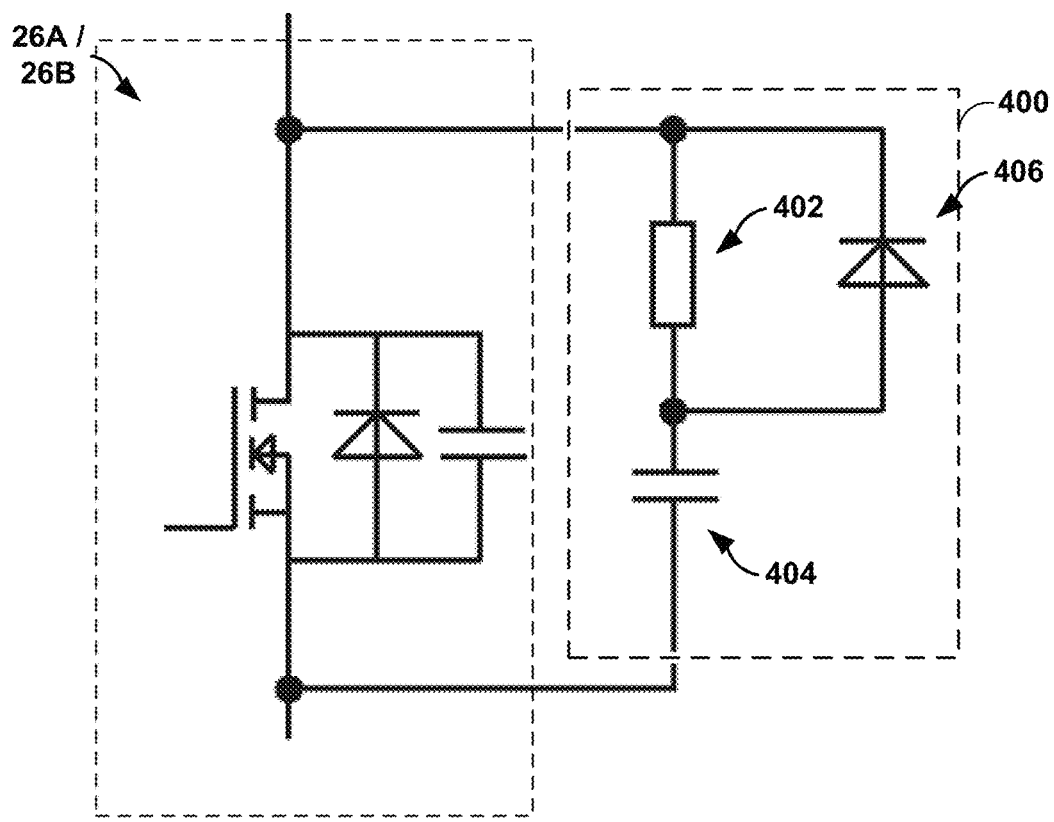
FIG. 8 is a circuit diagram that illustrates a discrete implementation of the example SR MOSFET shown in FIG. 5A.

FIG. 8 is a circuit diagram that illustrates a discrete implementation of the example SR MOSFET shown in FIG. 5A. In other words, SR MOSFET 90 may be formed using discrete components to achieve a similar result. FIG. 8 shows SR MOSFET 26A or 26B, i.e., a typical SR MOSFET, with a modified dissipative network 400 that includes diode 406 in parallel to resistive element 402 and in series with capacitive element 404. However, the discrete solution is less advantageous as compared to the integrated solutions described above. For examples, in addition to the already mentioned disadvantages described above that discrete components can have, the external components may add additional stray inductance, due to the connections of these external parts, and may add additional capacitance 404 thus increasing the energy loss.

Clause 1. A transistor device configured as a synchronous rectifier, the transistor device comprising: a gate terminal, a source terminal; a drain terminal; and a field-plate electrode including an integrated diode, wherein the integrated diode is configured to discharge a parasitic capacitance of the transistor device during each switching operation of the synchronous rectifier.

Clause 2. The transistor device of clause 1, wherein the integrated diode is further configured to charge the parasitic capacitance of the transistor device during each switching operation of the synchronous rectifier.

Clause 3. The transistor device of any of clauses 1-2, wherein the field-plate electrode further includes a resistive element in parallel to the integrated diode of the field-plate electrode, wherein the resistive element is configured to charge the parasitic capacitance of the transistor device during each switching operation of the synchronous rectifier.

Clause 4. The transistor device of clause 3, wherein the integrated diode of the field-plate electrode has a blocking resistance that is approximately equal to a resistance of the resistive element of the field-plate electrode.

Clause 5. The transistor device of any of clauses 1-4, wherein the integrated diode of the field-plate electrode is further configured to dampen voltage overshoots between the source terminal and drain terminal Clause 6. The transistor device of any of clauses 1-5, wherein the integrated diode of the field-plate electrode is further configured to attenuate oscillations associated with a voltage between the source terminal and drain terminal Clause 7. The transistor device of any of clauses 1-6, wherein the integrated diode of the field-plate electrode is a Schottky diode or a P-N junction diode.

Clause 8. The transistor device of clause 7, wherein the integrated diode of the field-plate electrode is the Schottky diode and the field-plate electrode comprises a poly-silicon material that has n-type doping and is connected to the source terminal through a metallic material that is in contact with a plug.

Clause 9. The transistor device of clause 7, wherein the integrated diode of the field-plate electrode is the P-N junction diode and the field-plate electrode comprises a bottom portion comprising a first poly-silicon material that has n-type doping and a top portion comprising a second poly-silicon material that has p-type doping.

Clause 10. The transistor device of any of clauses 1-9, wherein the transistor device is a metal-oxide-semiconductor field-effect-transistor, the transistor device comprising: a gate terminal; and a body diode.

Clause 11. The transistor device of any of clauses 1-10, wherein the field-plate electrode is a first field-plate electrode, the transistor device further comprising:

a second field-plate electrode that includes a resistive element instead of an integrated diode, wherein the resistive element of the second field-plate electrode is configured to charge and discharge the parasitic capacitance of the transistor device with the integrated diode of the first field-plate electrode during each switching operation of the synchronous rectifier.

Clause 12. The transistor device of any of clauses 1-11, wherein the integrated diode configures the field-plate electrode to have a first resistance that is sufficient to charge the parasitic capacitance of the transistor device and configures the field-plate electrode to have a second resistance that prevents switching losses during discharge of the parasitic capacitance of the transistor device, wherein the second resistance is approximately zero.

Clause 13. A system comprising: a power source configured to provide power; a load configured to receive power; and a switch-mode power converter configured to convert and deliver the power provided by the power source to the load, the switch-mode power converter including: at least one metal-oxide-semiconductor field-effect-transistor device (MOSFET) that is configured as a synchronous rectifier, wherein the at least one MOSFET comprises a field-plate electrode configured to dampen voltage overshoots and attenuate oscillations associated with a drain-source voltage of the at least one MOSFET during switch-off of the at least one MOSFET.

Clause 14. The system of clause 13, wherein the field-plate electrode comprises an integrated diode configured to remove resistance associated with the field-plate electrode to discharge the parasitic capacitance during each switching operation of the at least one MOSFET.

Clause 15. The system of clause 14, wherein the integrated diode is further configured to provide the resistance associated with the field-plate electrode to charge the parasitic capacitance during each switching operation of the at least one MOSFET.

Clause 16. The system of any of clauses 14-15, wherein the field-plate electrode further includes a resistive element arranged in parallel to the integrated diode of the field-plate electrode, wherein the resistive element is configured to provide the resistance associated with the field-plate electrode to charge the parasitic capacitance during each switching operation of the at least one MOSFET.

Clause 17. The system of any of clauses 14-16, wherein the integrated diode of the field-plate electrode has a blocking resistance that is sufficient to charge the parasitic capacitance during each switching operation of the at least one MOSFET.

Clause 18. The system of any of clauses 14-17, wherein the integrated diode of the field-plate electrode is a Schottky diode or a P-N junction diode.

Clause 19. A metal-oxide-semiconductor field-effect-transistor (MOSFET) configured as a synchronous rectifier, the MOSFET comprising: a body diode; a gate terminal, a source terminal; a drain terminal; and a field-plate electrode comprising an integrated diode, wherein the integrated diode is configured to dampen voltage overshoots and attenuate oscillations associated with a voltage between the source terminal and drain terminal Clause 20. The MOSFET of clause 19, wherein the integrated diode is further configured to dampen the voltage overshoots and attenuate the oscillations associated with the voltage between the source terminal and drain terminal by at least charging and discharging the parasitic capacitance of the MOSFET.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples have been described. Many of the described examples concern techniques for communicating between the secondary and primary side of a flyback converter so as to enable the use of a common controller for both sides of the flyback converter. However, the described techniques for communicating between two sides of a transformer may also be used for other reasons, or in other transformer applications. These and other examples are within the scope of the following claims.

What is claimed is:

1. A transistor device configured as a synchronous rectifier, the transistor device comprising:
   a gate terminal;
   a source terminal;
   a drain terminal; and
   a field-plate electrode including an integrated diode, wherein the integrated diode is configured to discharge a parasitic capacitance of the transistor device during each switching operation of the synchronous rectifier.

2. The transistor device of claim 1, wherein the integrated diode is further configured to charge the parasitic capacitance of the transistor device during each switching operation of the synchronous rectifier.

3. The transistor device of claim 1, wherein the field-plate electrode further includes a resistive element in parallel to the integrated diode of the field-plate electrode, wherein the resistive element is configured to charge the parasitic capacitance of the transistor device during each switching operation of the synchronous rectifier.

4. The transistor device of claim 3, wherein the integrated diode of the field-plate electrode has a blocking resistance that is approximately equal to a resistance of the resistive element of the field-plate electrode.

5. The transistor device of claim 1, wherein the integrated diode of the field-plate electrode is further configured to dampen voltage overshoots between the source terminal and drain terminal.

6. The transistor device of claim 1, wherein the integrated diode of the field-plate electrode is further configured to attenuate oscillations associated with a voltage between the source terminal and drain terminal.

7. The transistor device of claim 1, wherein the integrated diode of the field-plate electrode is a Schottky diode or a P-N junction diode.

8. The transistor device of claim 7, wherein the integrated diode of the field-plate electrode is the Schottky diode and the field-plate electrode comprises a poly-silicon material that has n-type doping and is connected to the source terminal through a metallic material that is in contact with a plug.

9. The transistor device of claim 7, wherein the integrated diode of the field-plate electrode is the P-N junction diode and the field-plate electrode comprises a bottom portion comprising a first poly-silicon material that has n-type doping and a top portion comprising a second poly-silicon material that has p-type doping.

10. The transistor device of claim 1, wherein the transistor device is a metal-oxide-semiconductor field-effect-transistor, the transistor device comprising:
    a gate terminal; and
    a body diode.

11. The transistor device of claim 1, wherein the field-plate electrode is a first field-plate electrode, the transistor device further comprising:
    a second field-plate electrode that includes a resistive element instead of an integrated diode, wherein the resistive element of the second field-plate electrode is configured to charge and discharge the parasitic capacitance of the transistor device with the integrated diode of the first field-plate electrode during each switching operation of the synchronous rectifier.

12. The transistor device of claim 1, wherein the integrated diode configures the field-plate electrode to have a first resistance that is sufficient to charge the parasitic capacitance of the transistor device and configures the field-plate electrode to have a second resistance that prevents switching losses during discharge of the parasitic capacitance of the transistor device, wherein the second resistance is approximately zero.

13. A system comprising:
    a power source configured to provide power;
    a load configured to receive power; and
    a switch-mode power converter configured to convert and deliver the power provided by the power source to the load, the switch-mode power converter including:
      at least one metal-oxide-semiconductor field-effect-transistor device (MOSFET) that is configured as a synchronous rectifier, wherein the at least one MOSFET comprises a field-plate electrode configured to dampen voltage overshoots and attenuate oscillations associated with a drain-source voltage of the at least one MOSFET during switch-off of the at least one MOSFET.

14. The system of claim 13, wherein the field-plate electrode comprises an integrated diode configured to remove resistance associated with the field-plate electrode to discharge the parasitic capacitance during each switching operation of the at least one MOSFET.

15. The system of claim 14, wherein the integrated diode is further configured to provide the resistance associated with the field-plate electrode to charge the parasitic capacitance during each switching operation of the at least one MOSFET.

16. The system of claim 14, wherein the field-plate electrode further includes a resistive element arranged in parallel to the integrated diode of the field-plate electrode, wherein the resistive element is configured to provide the resistance associated with the field-plate electrode to charge the parasitic capacitance during each switching operation of the at least one MOSFET.

17. The system of claim 14, wherein the integrated diode of the field-plate electrode has a blocking resistance that is sufficient to charge the parasitic capacitance during each switching operation of the at least one MOSFET.

18. The system of claim 14, wherein the integrated diode of the field-plate electrode is a Schottky diode or a P-N junction diode.

19. A metal-oxide-semiconductor field-effect-transistor (MOSFET) configured as a synchronous rectifier, the MOSFET comprising:
    a body diode;
    a gate terminal;
    a source terminal;
    a drain terminal; and
    a field-plate electrode comprising an integrated diode, wherein the integrated diode is configured to dampen voltage overshoots and attenuate oscillations associated with a voltage between the source terminal and drain terminal.

20. The MOSFET of claim 19, wherein the integrated diode is further configured to dampen the voltage overshoots and attenuate the oscillations associated with the voltage between the source terminal and drain terminal by at least charging and discharging the parasitic capacitance of the MOSFET.

* * * * *